US009087944B1

(12) United States Patent
Roberts et al.

(10) Patent No.: US 9,087,944 B1
(45) Date of Patent: Jul. 21, 2015

(54) NANOPLASMONIC CAVITIES FOR PHOTOVOLTAIC APPLICATIONS

(71) Applicant: THE UNITED STATES OF AMERICA AS REPRESENTED BY THE SECRETARY OF THE NAVY, Washington, DC (US)

(72) Inventors: M. Joseph Roberts, Ridgecrest, CA (US); Simin Feng, Waldorf, MD (US); Zachary A. Sechrist, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 242 days.

(21) Appl. No.: 13/667,188

(22) Filed: Nov. 2, 2012

Related U.S. Application Data

(63) Continuation of application No. 13/658,573, filed on Oct. 23, 2012.

(60) Provisional application No. 61/624,811, filed on Apr. 16, 2012.

(51) Int. Cl.
*H01L 31/00* (2006.01)
*H01L 31/0352* (2006.01)
*B82Y 20/00* (2011.01)

(52) U.S. Cl.
CPC ......... *H01L 31/035209* (2013.01); *B82Y 20/00* (2013.01); *Y02E 10/542* (2013.01); *Y10S 977/734* (2013.01); *Y10S 977/742* (2013.01)

(58) Field of Classification Search
CPC ...................................... Y02E 10/542
USPC .................................. 136/243–265
See application file for complete search history.

(56) References Cited

U.S. PATENT DOCUMENTS

| | | | |
|---|---|---|---|
| 6,188,012 B1 * | 2/2001 | Ralph ........................... | 136/246 |
| 8,183,656 B2 | 5/2012 | Okamoto et al. | |
| 2004/0194821 A1 * | 10/2004 | Chittibabu et al. ........... | 136/263 |
| 2006/0070653 A1 * | 4/2006 | Elrod et al. .................... | 136/263 |
| 2006/0219289 A1 * | 10/2006 | Skryabin et al. .............. | 136/244 |
| 2009/0032104 A1 * | 2/2009 | Lee et al. ....................... | 136/261 |

OTHER PUBLICATIONS

Sigma-Aldrich, Ruthenium-based dyes for Dye solar cells.*
N. Lindquist, W. Luhman, S. Oh, & R. Holmes, Plasmonic Nanocavity Arrays for Enhanced Efficiiency in Organic Photovoltaic Cells, Appl Phys Lett, Sep. 28, 2008, 93, 123308, USA.

(Continued)

*Primary Examiner* — Alison Bourke
*Assistant Examiner* — Niki Bakhtiari
(74) *Attorney, Agent, or Firm* — James M. Saunders

(57) ABSTRACT

Nanoplasmonic cavities for photovoltaic applications include at least one transparent conductive substrate. A first plasmonic electrically conductive nanostructure layer is associated with the transparent conductive substrate. At least one photoabsorber layer is associated with the first plasmonic electrically conductive nanostructure layer. At least one electron transfer layer is associated with the photoabsorber layer. A second plasmonic electrically conductive nanostructure layer is associated with the electron transfer layer.

14 Claims, 6 Drawing Sheets

(56) References Cited

OTHER PUBLICATIONS

S. Pillai, K. Catchpole, T. Trupke, & M. Green, Surface Plasmon Enhanced Silicon Solar Cells, J Appl Phys, May 7, 2007, 101, 093105, USA.

N. Panoiu & R. Osgood, Jr., Enhanced Optical Absorption for Photovoltaics via Excitation of Waveguide and Plasmon-Polariton Modes, Opt Lett, Sep. 25, 2007, 32, 2825-2827, USA.

* cited by examiner

NANOPLASMONIC CAVITIES FOR PHOTOVOLTAIC APPLICATIONS

CROSS-REFERENCE TO RELATED APPLICATIONS

This is a continuation application, claiming the benefit of both parent non-provisional application Ser. No. 13/658,573 filed on Oct. 23, 2012 and parent provisional application No. 61/624,811 filed on Apr. 16, 2012, whereby the entire disclosures of which are incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to power devices, and more particularly, to improving the efficiency of portable photovoltaic (PV) power devices and the sensitivity of visible and near-infrared photodetectors.

Figure 1:
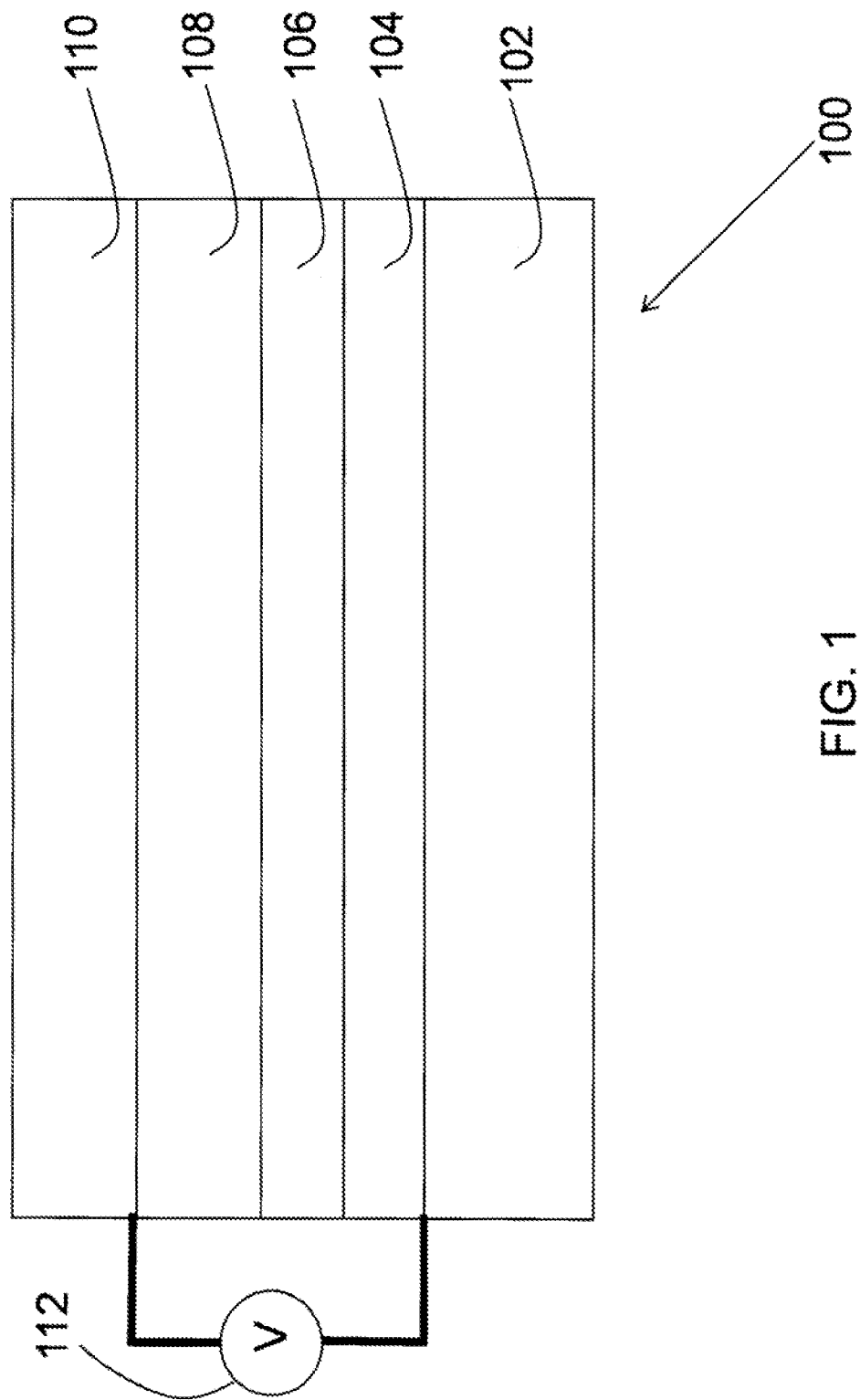
FIG. 1 is a side perspective view of an excitonic photocell having nanoplasmonic cavities, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to power devices, and more particularly, to improving the efficiency of portable photovoltaic (PV) power devices and the sensitivity of visible and near-infrared (IR) photodetectors.

Embodiments of the invention address a U.S. Navy need for lower cost, low mass, efficient photovoltaic power sources that are flexible and durable. These PV power sources can be used for several applications such as, for example, remote sensing stations and survival equipment.

Embodiments of the invention include a device fabrication process by electrostatic sells-assembly of organic conjugated polyelectrolytes and atomic layer deposition of titanium dioxide. Embodiments utilize light harvesting materials, such as electrolyte-substituted polythiophenes, to self-assemble conformal nanofilm coatings. The layer-by-layer deposition (ESD) technique enables precise (within a few nanometers) control over the film thickness, the concentration gradient of each component of the film, and precise positioning of the maximum concentration of each component. The surface of titanium dioxide is a well-known efficient charge-separation interface commonly used in dye-sensitized solar cells. The titanium dioxide further serves to transport electrons. In an example of embodiments of the invention, titanium dioxide was deposited using atomic layer deposition (ALD). ALD produces high quality wide area films with nanometer control of thickness. Using materials selected for maximum compatibility, multi-layer structures may be fabricated by methods that have demonstrated capability for rapid scale-up for mass production of large area devices.

Embodiments of the invention demonstrate atomic layer deposition of titanium dioxide on electrostatic self-assembly of organic conjugated polyelectrolytes and plasmonic coupling of light to an embedded silver layer. This embodies the construct and fabrication of an overlayer for PV devices which serves multiple functions, namely, antireflection, encapsulation, and most importantly, visible to near IR light focusing with numerical aperture matched for efficient launching of plasmonic waves into the metallodielectric nanolayers.

The nanostructures are constructed to enhance the absorbance of incident photons. The nanostructures are constructed to support propagating as well as localized plasmonic modes. The substrate is alternately brought into contact with a solution (or dispersion) of positively-charged particles and a solution of negatively-charged particles. The resulting photoabsorber film is conformal with thickness controllable to within +/− 1 nanometer (nm). In this example, the polyelectrolytes are both functionalized polythiophenes. ALL) is a chemical vapor deposition method in which film thickness may be controlled to within +/− 0.2 nm.

Embodiments of the invention yield the following: (1) plasmonic enhancement of light absorbance, (2) nanostructures set up plasmonic interference pattern thus trapping the light energy and leading to light propagation along plasmonic surfaces, and (3) polythiophene chains lie in plane and absorb light more efficiently travelling parallel. This construction causes a fraction of the incident light to travel parallel to the chains.

Although embodiments of the invention are described in considerable detail, including references to certain versions thereof, other versions are possible such as, for example, orienting the layers in different fashion. Therefore, the spirit and scope of the appended claims should not be limited to the description of versions included herein.

In the accompanying drawings, like reference numbers indicate like elements. FIG. 1 illustrates a side perspective view of an excitonic photocell having nanoplasmonic cavities, according to embodiments of the invention. Reference character 100 depicts an apparatus of embodiments of the invention. The apparatus 100, an excitonic solar cell may also be referred to with other descriptions including, but not limited to, a photovoltaic power device without detracting from the merits or generality of embodiments of the invention. Likewise, various components/layers may be referred to with similar varying terminology. For example, some layers are referred to as first plasmonic electrically conductive nanostructure layer in one embodiment and in a different embodiment are referred to as a primary plasmonic electrically conductive nanostructure layer without detracting from the merits or generality of embodiments of the invention.

Embodiments of the invention generally relate to an excitonic solar ell, including at least one transparent conductive substrate 102. A first plasmonic electrically conductive nanostructure layer 104 is associated with the transparent conductive substrate 102. At least one photoabsorber layer 106 is associated with the first plasmonic electrically conductive nanostructure layer 104. At least one electron transfer layer 108 is associated with the photoabsorber layer 106. A second plasmonic electrically conductive nanostructure layer 110 is associated with the electron transfer layer 108. The electron transfer layer 108 is deposited by atomic layer deposition on the photoabsorber layer 106.

Another embodiment of the invention generally relates to a process of making an excitonic solar cell, including depositing a first plasmonic electrically conductive nanostructure layer 104 on at least one transparent conductive substrate 102. At least one photoabsorber layer 106 is deposited on the first plasmonic electrically conductive nanostructure 104. At least one electron transfer layer 108 is deposited on the photoabsorber layer 106 by atomic layer deposition. A second plasmonic electrically conductive nanostructure layer 110 is deposited on the electron transfer layer 108.

Figure 2:
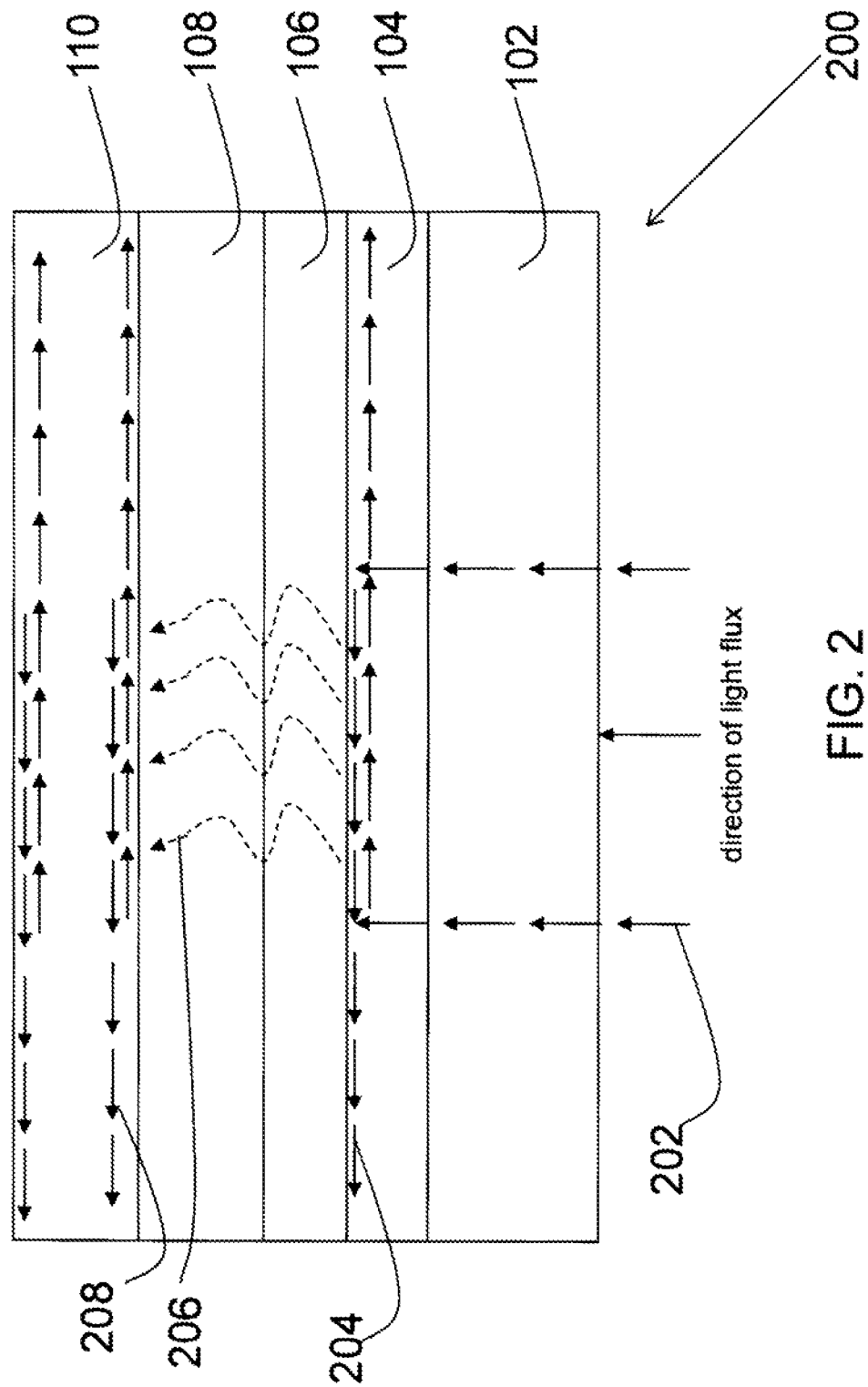
FIG. 2 is a side perspective view of an excitonic photocell depicting light flow into and within nanoplasmonic cavities, according to embodiments of the invention.

In yet another embodiment, the invention generally relates to an excitonic solar cell made according to the process disclosed above. The product by process in this example is a solar cell, more specifically, an excitonic solar cell. FIG. 2 illustrates a side perspective view of an excitonic photocell depicting light flow into and within nanoplasmonic cavities, according to embodiments of the invention. The depiction is represented as reference character 200. Excitonic solar cells have a charge separation interface. Charge separation occurs at the interface of photoabsorber 106 and the electron transfer layer 108. As light 202 passes through the apparatus 200, a fraction of the photons excite electrons within the photoabsorber 106 to a higher energy level. The electron-hole pair (also referred to as an exciton) is short-lived. Excitons decay by a number of processes but predominately by recombination. Plasmons are light energy flowing and are depicted as reference character 204. The plasmons 204 may transfer to a nearby metal surface (transferred plasmons are depicted as reference character 208) through evanescent coupling (shown as reference character 206).

When the exciton is nearby a charge separation interface, the electron may jump to the electron transfer layer 108 leaving a hole in the photoabsorber 106. Typically, many excitons are produced and exist simultaneously. At the charge separation interface, this leads to higher concentration of electrons on one side and high concentration of holes on the other. The electrons move away from the interface due to charge repulsion and diffuse away from the region of high concentration. Likewise, at the other side of the interface, holes diffuse away.

In embodiments, the transparent conductive substrate 102 is typically constructed by coating glass, plastic, or polyethylene terephthalate (PET) with transparent conductive materials such as, for example, indium tin oxide, fluorine-doped tin oxide, carbon nanotubes, graphene, and aluminum-doped zinc oxide. In some embodiments, the first plasmonic electrically conductive nanostructure layer 104 is deposited on the transparent conductive substrate 102 by physical vapor deposition. In other embodiments, the first plasmonic electrically conductive nanostructure layer 104 is deposited on the transparent conductive substrate 102 by electrodeposition.

In embodiments, the first and second plasmonic electrically conductive nanostructure layers 104 and 110 are selected from the group consisting of silver, gold, aluminum, copper, platinum, graphene, and carbon nanotubes. The photoabsorber layer 106 is deposited by electrostatic deposition on the first plasmonic electrically conductive nanostructure layer 104. Photoabsorber layer 106 materials may be conjugated polymers, dyes, semiconductors, such as, for example, silicon and germanium, and quantum dots.

The electron transfer layer 108 is at least one electron transfer film, such as, for example, titanium dioxide. In some embodiments, the second plasmonic electrically conductive nanostructure layer 110 is deposited on the electron transfer layer 108 by physical vapor deposition, while in other embodiments, the second plasmonic electrically conductive nanostructure layer 110 is deposited on the electron transfer layer 108 by electrodeposition. A voltage meter 112 (FIG. 1) is shown to depict that the apparatus 100 is a power device. Free space (air) is modeled to surround the apparatus 100.

Significant modeling of embodiments of the invention suggests that film and interface properties of thickness, purity, absorption, and relative energy level among others, are important parameters to control in the pursuit of more efficient excitonic solar cells. Embodiments of the invention combine the film deposition techniques of electrodeposition and atomic layer deposition. Both of these techniques are well suited for large area, robust films. These techniques make efficient use of materials leading to economical light weight solar cell production. Furthermore, the techniques are compatible with plasmonic nanostructures that will improve photoabsorbance efficiency.

Figure 3:
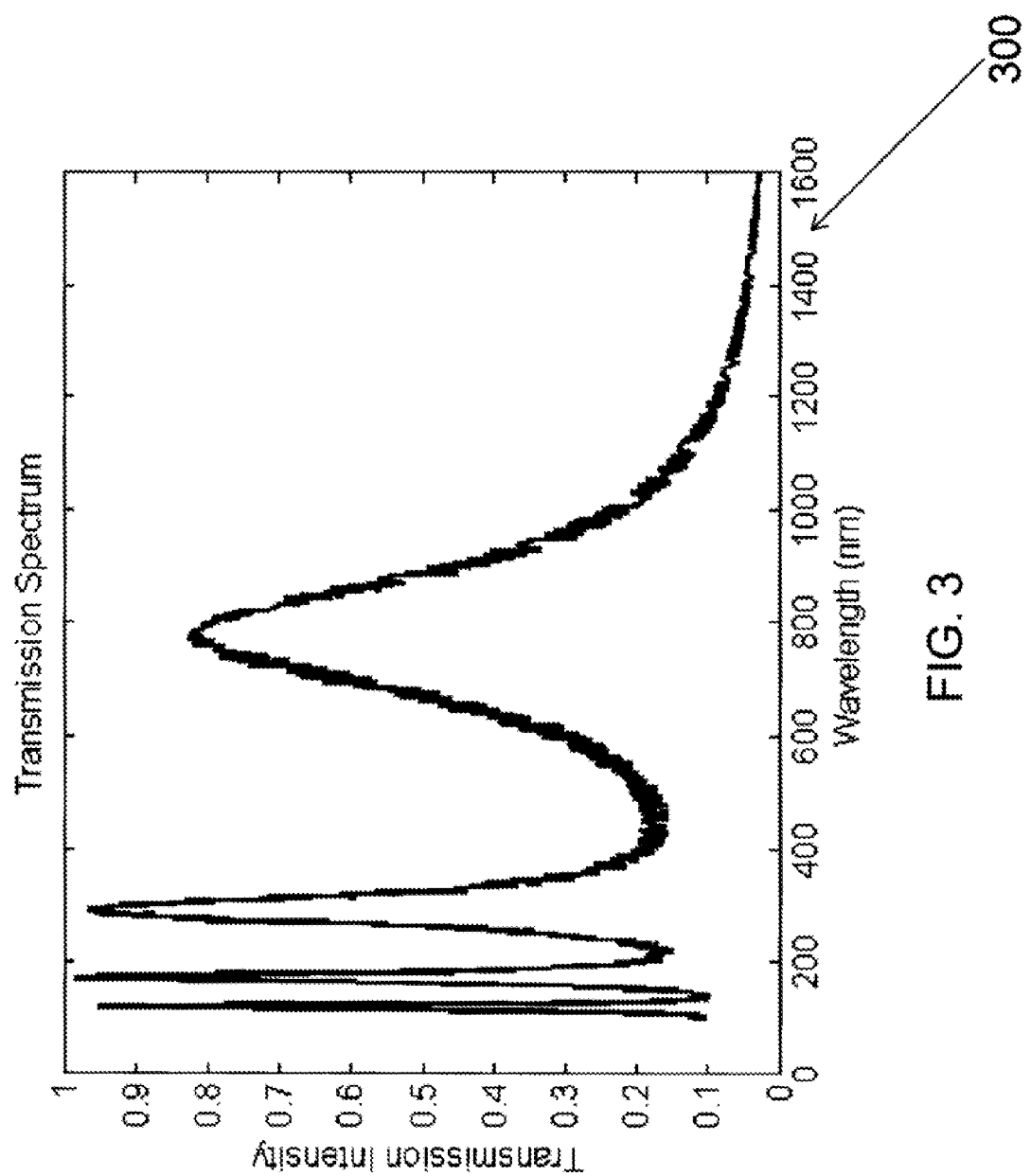
FIG. 3 is a graphical comparison of light transmission through resonant nanolayers, according to embodiments of the invention.
Figure 4:
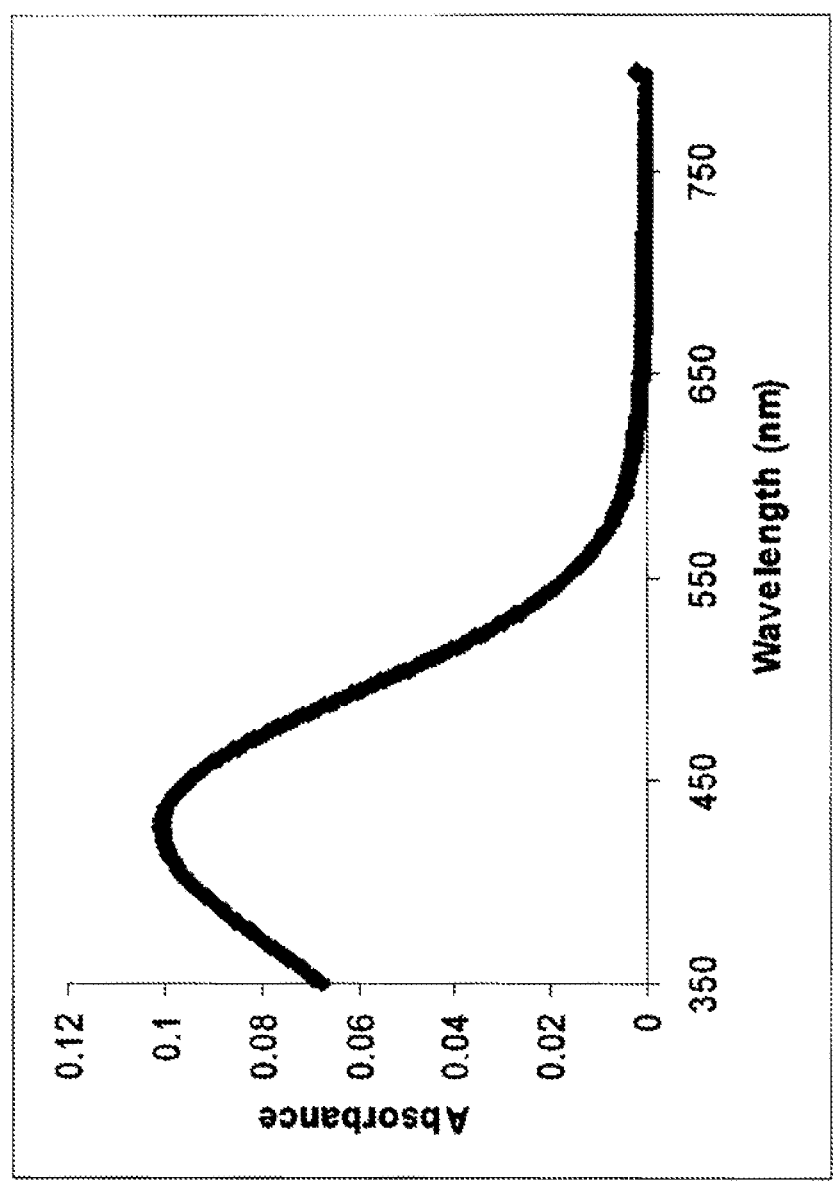
FIG. 4 is a graphical comparison of the absorbance spectrum for a polythiophene film, according to embodiments of the invention.

Scattering matrix techniques using Maxwell's equations were used to simulate embodiments of the invention. FIG. 3 is a graphical comparison of light transmission through resonant nanolayers, according to embodiments of the invention, and is depicted as reference character 300. FIG. 3 may also be thought of as a simulation of the plasmonic cavity. FIG. 4 is a graphical comparison of the absorbance spectrum for a polythiophene film, according to embodiments of the invention, and is depicted as reference character 400.

In FIG. 3, the parameters used in the simulation are as follows: polythiophene equal to 25 nm in thickness, silver for the first and second plasmonic electrically conductive nanostructure layers 104 and 110, each having a thickness of 28 nm, and titanium dioxide for the electron transfer layer 108, having a thickness of 25 urn. A comparison of FIGS. 3 and 4 indicate that a minima in transmission corresponds with an absorbance peak of polythiophene.

Figure 5:
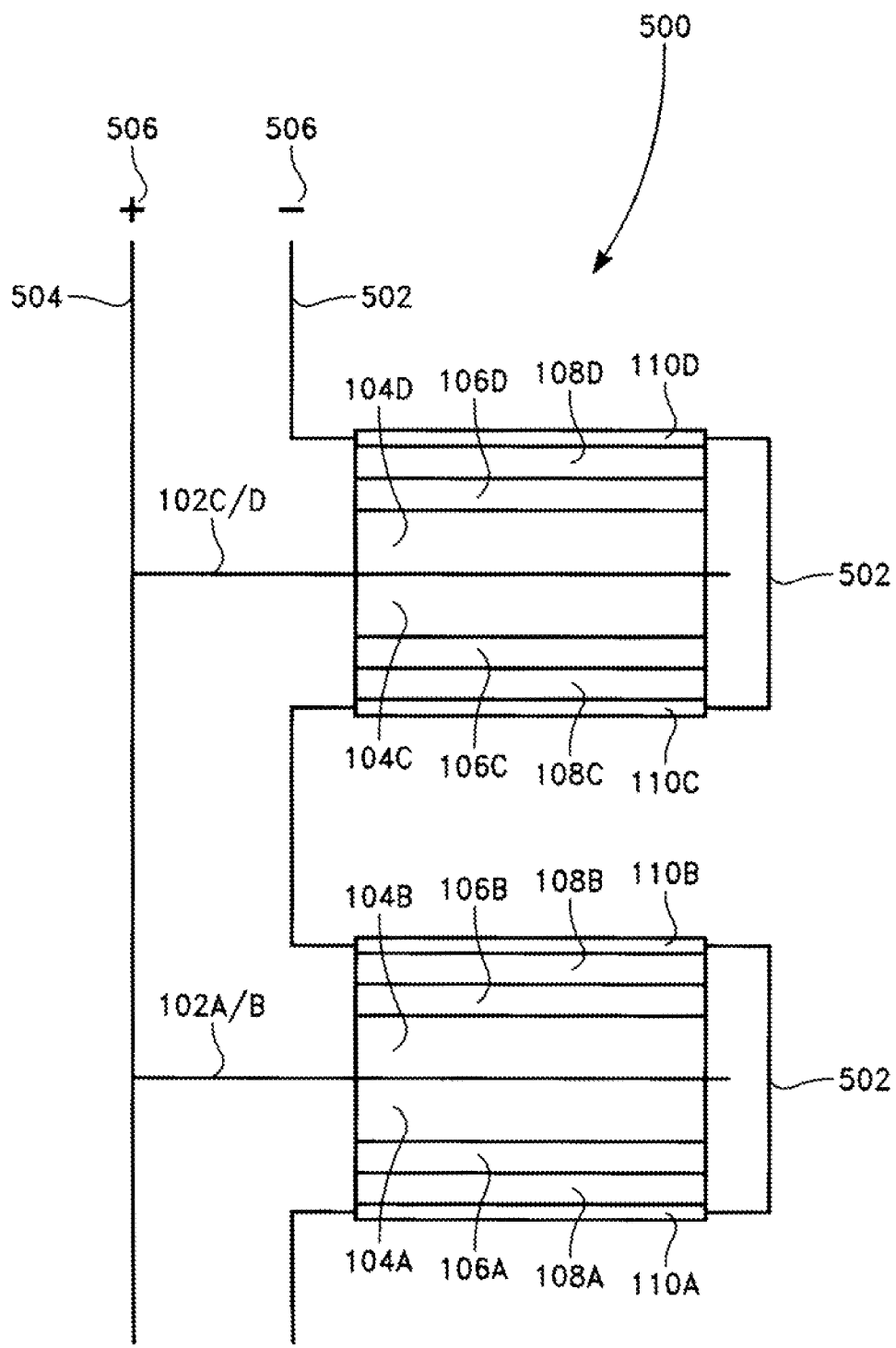
FIG. 5 is an exploded view of stacked photocells having nanoplasmonic cavities, according to embodiments of the invention.

Another embodiment of the invention is illustrated in FIG. 5 and depicts an exploded view of stacked excitonic solar cells having nanoplasmonic cavities, according to embodiments of the invention. An apparatus according to this embodiment is depicted as reference character 500, and includes at least one flexible transparent conductive substrate 102A/B/C/D. At least one nanoplasmonic sandwich layer (the sandwich layer includes reference characters 104A through 110A, 1040 through 110B, 104C through 110C, and 104D through 110D is tuned to a predetermined spectral range. The flexible transparent conductive substrates 102A/B/C/D coupled with the respective nanoplasmonic sandwich layers (reference characters 104A through 110A, 104B through 110B, 104C through 110C, and 104D through 110D form stacked excitonic solar cells 500.

The nanoplasmonic sandwich layers (reference characters 104A through 110A, 104B through 110B, 104C through 110C, and 104D through 110D are associated with the flexible transparent conductive substrate 102A/B/C/D. At least one electrical lead 502 connects adjacent excitonic solar cells such as, for example, reference character layers 102A/B, 104A, 106A, 108A, and 110A with reference character layers 102A/B, 104B, 106B, 108B, and 110B. Each of the flexible transparent conductive substrates 102A/B/C/D is electrically connected (the electrical connection is depicted as reference character 504, which may be any appropriate electrical connection such as, for example, an electrical busbar) to at least one power storage device, depicted as reference character 506, such as, for example, a capacitor.

The electrical busbar 504 completes an electrical circuit. Low energy electrons flow in to fill holes vacated by the excited electrons. The apparatus 500 may also be connected to power electrical devices such as, for example, electrical motors without detracting from the merits or generality of embodiments of the invention.

The flexible transparent conductive substrate 102A/B/C/D is configured to fold and maintain electrical conductivity with layers 104A/B/C/D and as well as the electrical connection 504. The foldable nature of the flexible transparent conductive substrate 102A/B/C/D offers the ability for the apparatus 500 to be repeatable such that, for example, numerous excitonic photocells (reference characters 104A through 110A, 104B through 110B, 104C through 110C, and 104D through 110D) may be formed and stacked on top of one another. The flexible transparent conductive substrate 102A/B/C/D, at a molecular level, is at least partially disordered and amorphous at the processing temperature.

The nanoplasmonic sandwich layers (reference characters 104A through 110A, 104B through 110B, 104C through 110C, and 104D through 110D are structures that include at least one primary plasmonic electrically conductive nanostructure layer 104A/B/C/D associated with the flexible transparent conductive substrate 102A/B/C/D. At least one photoabsorber layer 106A/B/C/D is deposited by electrostatic deposition on the primary plasmonic electrically conductive nanostructure layer 104A. At least one electron transfer layer 108A/B/C/D is deposited by atomic layer deposition on the photoabsorber layer 106A/B/C/D. At least one secondary plasmonic electrically conductive nanostructure layer 110A/B/C/D is associated with the electron transfer layer 108A/B/C/D.

Another embodiment of the invention generally relates to a process of making stacked excitonic solar cell(s), including depositing at least one primary plasmonic electrically conductive nanostructure layer 104A/B/C/D on at least one flexible transparent conductive substrate 102A/B and 102C/D. At least one photoabsorber layer 106A/B/C/D is deposited on the primary plasmonic electrically conductive nanostructure 104A/B/C/D. At least one electron transfer layer 108A/B/C/D is deposited on the photoabsorber layer 106A/B/C/D by atomic layer deposition. At least one secondary plasmonic electrically conductive nanostructure layer 110A/B/C/D is deposited on the electron transfer layer 108A/B/C/D.

The deposition tasks described above are iterated through repeatedly to form stacked solar cells. The iteration includes the depositing of the primary plasmonic electrically conductive nanostructure layer 104A/B/C/D on the flexible transparent conductive substrate 102A/B/C/D task; the depositing of the photoabsorber layer 106A/B/C/D on the primary plasmonic electrically conductive nanostructure layer 104A/B/C/D task; the depositing of the electron transfer layer 108A/B/C/D on the photoabsorber layer 106A/B/C/D by atomic layer deposition task; and the depositing of the secondary plasmonic electrically conductive nanostructure layer 110A/B/ C/D on the electron transfer layer 108A/B/C/D task. The iteration is performed a predetermined n number of times and is based on application specific conditions. The predetermined number n is selected from the range of whole numbers 2 through 10.

The completion of each iteration configures diametrically-opposed distinct sets of stacked excitonic solar cell(s). The flexible transparent conductive substrate 102A/B & 102C/D is folded the predetermined number n minus 1 times. Each folding task is performed between each of the distinct sets of stacked excitonic solar cell(s), so that each of the folding tasks juxtaposes adjacent distinct sets of stacked excitonic solar cell(s) on top of each other. Folding techniques are based on application-specific conditions. As such several folding techniques may be employed such as, for example, accordion-folding, without detracting from the merits or generality of embodiments of the invention.

In yet another embodiment, the invention generally relates to an excitonic solar cell made according to the process disclosed above. The product by process in this example is a solar cell, more specifically, a stacked excitonic solar cell.

In embodiments, nanoplasmonic cavities are the sum of the thicknesses of layers 106 and 108. The predetermined spectral range for tuning is the range of about 350 to 700 nanometers. Tuning occurs by varying the thickness of the photoabsorber layers 106A/B/C/D and the electron transfer layers 108A/B/C/D. In embodiments having stacked orientations, layers may be independently tuned for different spectral ranges. As an example, layers 106A and 108A in FIG. 5 may be independently tuned to a different spectral range than layers 106D and 108D. Adjacent distinct sets of excitonic solar cell(s) are connected by at least one electrical lead 502. The distinct sets of stacked excitonic solar cell(s) are electrically connected to the power storage device 506. The electrical lead 502 and electrical busbar 504 are conductive materials such as, for example, aluminum, silver, and copper.

Figure 6:
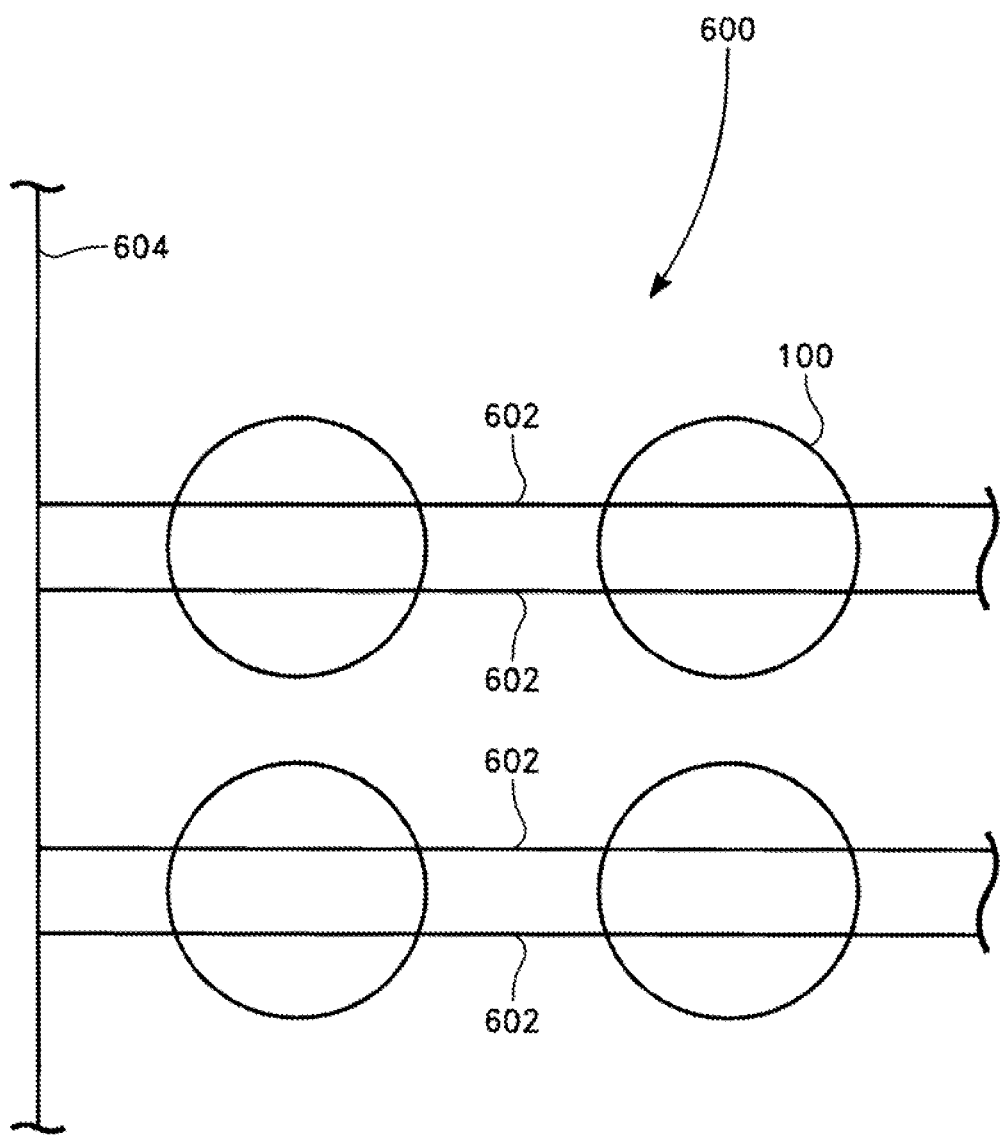
FIG. 6 is a plan view of a photovoltaic power source having nanoplasmonic cavity arrays, according to embodiments of the invention.

Another embodiment of the invention is illustrated in FIG. 6 and depicts a plan view of a photovoltaic power source having nanoplasmonic cavity arrays, according to embodiments of the invention. An apparatus according to this embodiment is depicted as reference character 600, and includes an array of excitonic solar cells (reference character 100 in FIGS. 1 and 6). At least one electrical contact 602 is associated with the array of excitonic solar cells 100. At least one electrical bus 604 is associated with the electrical contacts 602. Individual excitonic solar cells 100 in the apparatus 600 are as depicted in FIG. 1 and described above.

Another embodiment of the invention generally relates to a process of making a photovoltaic power source, including providing an array of excitonic solar cells 100. A first plasmonic electrically conductive nanostructure layer 104 is deposited on at least one transparent conductive substrate 102. At least one photoabsorber layer 106 is deposited on the first plasmonic electrically conductive nanostructure layer 104 by electrostatic deposition. At least one titanium dioxide electron transfer layer 108 is deposited on the photoabsorber layer 106 by atomic layer deposition. A second plasmonic electrically conductive nanostructure layer 110 is deposited on the electron transfer layer 108. The array of excitonic solar cells 100 are connected together with at least one electrical contact 602. The electrical contact 602 terminates at the electrical bus 604.

In some embodiments, the array of excitonic solar cells 100 are connected in series by the electrical contact 602 and then to the electrical bus 604. In other embodiments, the array of excitonic solar cells 100 are connected in parallel by the electrical contact 602 and then to the electrical bus 604. The electrical contact 602 and the electrical bus 604 are conductive materials such as, for example, aluminum, silver, and copper.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A stacked photovoltaic device, comprising:
   a first solar cell bonded to a first flexible transparent conductive substrate, wherein said first flexible transparent conductive substrate is electrically-connected to an electrical busbar;
   a second solar cell bonded to said first flexible transparent conductive substrate, wherein said first solar cell and said second solar cell are positioned diametrically-opposed from each other, wherein said first solar cell and said second solar cell are electrically-connected to each other;
   a third solar cell bonded to a second flexible transparent conductive substrate, said second flexible transparent conductive substrate is electrically-connected to said electrical busbar;
   a fourth solar cell bonded to said second flexible transparent conductive substrate, wherein said third solar cell and said fourth solar cell are positioned diametrically-opposed from each other, wherein said third solar cell and said fourth solar cell are electrically-connected to each other;
   wherein each of said solar cells, comprises:
      a first electrically-conductive nanostructure layer;
      at least one photoabsorber layer associated with said first electrically conductive nanostructure layer;
      at least one electron transfer layer associated with said at least one photoabsorber layer;
      a second electrically-conductive nanostructure layer associated with said at least one electron transfer layer; and
   wherein said electrical busbar is electrically connected to at least one power storage device;
   wherein said first electrically-conductive nanostructure layer and said second electrically-conductive nanostructure layer are 28 nm thick of silver, said at least one photoabsorber layer is 25 nm thick of polythiophene, and said at least one electron transfer layer is 25 nm thick layer of titanium dioxide.

2. The device according to claim 1, wherein said first flexible transparent conductive substrate and said second flexible transparent conductive substrate are configured to fold and maintain electrical conductivity.

3. The device according to claim 1, wherein said association of said at least one photoabsorber layer and said at least one electron transfer layer have a predetermined spectral range of about 350 to 700 nanometers.

4. The device according to claim 1, wherein said at least one electron transfer layer is titanium dioxide.

5. The device according to claim 1, wherein said at least one photoabsorber layer is comprised of polythiophene.

6. The device according to claim 1, wherein said electrical connection of said first and second solar cells are electrical leads and wherein said electrical connection of said third and fourth solar cells are electrical leads.

7. A stacked photovoltaic device, comprising:
   first and second solar cells bonded to a first flexible transparent conductive substrate, said first and second solar cells positioned diametrically-opposed from each other, wherein said first and second solar cells are electrically-connected to each other;
   third and fourth solar cells bonded to a second flexible transparent conductive substrate, said third and fourth solar cells positioned diametrically-opposed from each other, wherein said third and fourth solar cells are electrically-connected to each other;
   wherein each of said solar cells, comprises:
      a first electrically-conductive nanostructure layer;
      at least one photoabsorber layer associated with said first electrically-conductive nanostructure layer;
      at least one electron transfer layer associated with said at least one photoabsorber layer;
      a second electrically-conductive nanostructure layer associated with said at least one electron transfer layer;
   wherein said first and second flexible transparent conductive substrates are electrically-connected to an electrical busbar, said electrical busbar is electrically-connected to at least one power storage device;
   wherein said first electrically-conductive nanostructure layer and said second electrically-conductive nanostructure layer are 28 nm thick of silver, said at least one photoabsorber layer is 25 nm thick of polythiophene, and said at least one electron transfer layer is 25 nm thick layer of titanium dioxide.

8. The device according to claim 7, wherein said first flexible transparent conductive substrate and said second flexible transparent conductive substrate are configured to fold and maintain electrical conductivity.

9. The device according to claim 7, wherein said association of said at least one photoabsorber layer and said at least one electron transfer layer have a predetermined spectral range of about 350 to about 700 nanometers.

10. The device according to claim 7, wherein said at least one electron transfer layer is titanium oxide.

11. The device according to claim 7, wherein said at least one photoabsorber layer is comprised of polythiophene.

12. The device according to claim 7, wherein said electrical connection of said first and second solar cells are electrical leads and wherein said electrical connection of said third and fourth solar cells are electrical leads.

13. The device according to claim 2, wherein said folding is accordion folding.

14. The device according to claim 8, wherein said folding is accordion folding.

* * * * *